(12) United States Patent
Zhao (10) Patent No.: US 10,297,957 B2
(45) Date of Patent: May 21, 2019

(54) ELECTRICAL CONNECTOR HAVING A SHIELDING SHELL WITH LATERALLY EXTENDING SPRING TANGS

(71) Applicant: FOXCONN INTERCONNECT TECHNOLOGY LIMITED, Grand Cayman (KY)

(72) Inventor: Jun Zhao, HuaiAn (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/877,347

(22) Filed: Jan. 22, 2018

(65) Prior Publication Data
US 2018/0212368 A1 Jul. 26, 2018

(30) Foreign Application Priority Data
Jan. 20, 2017 (CN) ...................... 2017 2 0076545 U (51) Int. Cl.
| | | |
|---|---|---|
| H01R 13/658 | (2011.01) |
| H01R 13/6583 | (2011.01) |
| H01R 12/72 | (2011.01) |
| H01R 13/66 | (2006.01) |
| H01R 13/6582 | (2011.01) |
| H01R 13/642 | (2006.01) |
| H01R 107/00 | (2006.01) |
| H01R 24/28 | (2011.01) |
| H01R 24/60 | (2011.01) |
| H01R 12/57 | (2011.01) |

(52) U.S. Cl.
CPC ....... *H01R 13/6583* (2013.01); *H01R 12/724* (2013.01); *H01R 13/6582* (2013.01); *H01R 13/6658* (2013.01); *H01R 12/57* (2013.01); *H01R 13/642* (2013.01); *H01R 24/28* (2013.01); *H01R 24/60* (2013.01); *H01R 2107/00* (2013.01); *H05K 2201/10189* (2013.01)

(58) Field of Classification Search
CPC ...................................................... H01R 24/60
See application file for complete search history.

(56) References Cited

U.S. PATENT DOCUMENTS

| | | | | |
|---|---|---|---|---|
| 9,362,680 B2* | 6/2016 | Kao | .............. | H01R 13/6583 |
| 9,502,827 B2* | 11/2016 | Feng | .............. | H01R 13/6581 |
| 9,843,142 B2* | 12/2017 | Hack | .............. | H01R 13/6583 |
| 2015/0229077 A1 | 8/2015 | Little et al. | | |

FOREIGN PATENT DOCUMENTS

| | | |
|---|---|---|
| CN | 204464604 | 7/2015 |
| TW | I560961 | 12/2016 |

\* cited by examiner

*Primary Examiner* — Ross N Gushi
(74) *Attorney, Agent, or Firm* — Wei Te Chung; Ming Chieh Chang (57) ABSTRACT

An electrical connector includes: an insulative housing having a central receiving space; two rows of contacts secured to the housing and exposed inwardly to the receiving space; and a shielding shell enclosing the insulative housing, the shielding shell having a respective pair of spring tangs at each of two opposite walls thereof, each of the spring tang extending laterally in a cantilevered manner into the receiving space.

7 Claims, 8 Drawing Sheets

ELECTRICAL CONNECTOR HAVING A SHIELDING SHELL WITH LATERALLY EXTENDING SPRING TANGS

BACKGROUND OF THE INVENTION

1. Field of the Invention

The present invention relates to an electrical connector including an insulative housing having a central receiving space and a shielding shell having integral spring tangs extending laterally in a cantilevered manner into the receiving space.

2. Description of Related Art

China Patent No. 204464604 discloses a plug connector having a shielding shell and a separate pair of spring pieces located inside the shielding shell. Taiwan Patent No. 560961 discloses an electrical connector including a shielding shell having a pair of integral latches.

SUMMARY OF THE INVENTION

An electrical connector comprises: an insulative housing having a central receiving space; two rows of contacts secured to the housing and exposed inwardly to the receiving space; and a shielding shell enclosing the insulative housing, the shielding shell having a respective pair of spring tangs at each of two opposite walls thereof, each of the spring tang extending laterally in a cantilevered manner into the receiving space.

DETAILED DESCRIPTION OF THE PREFERRED EMBODIMENT

Figure 1:
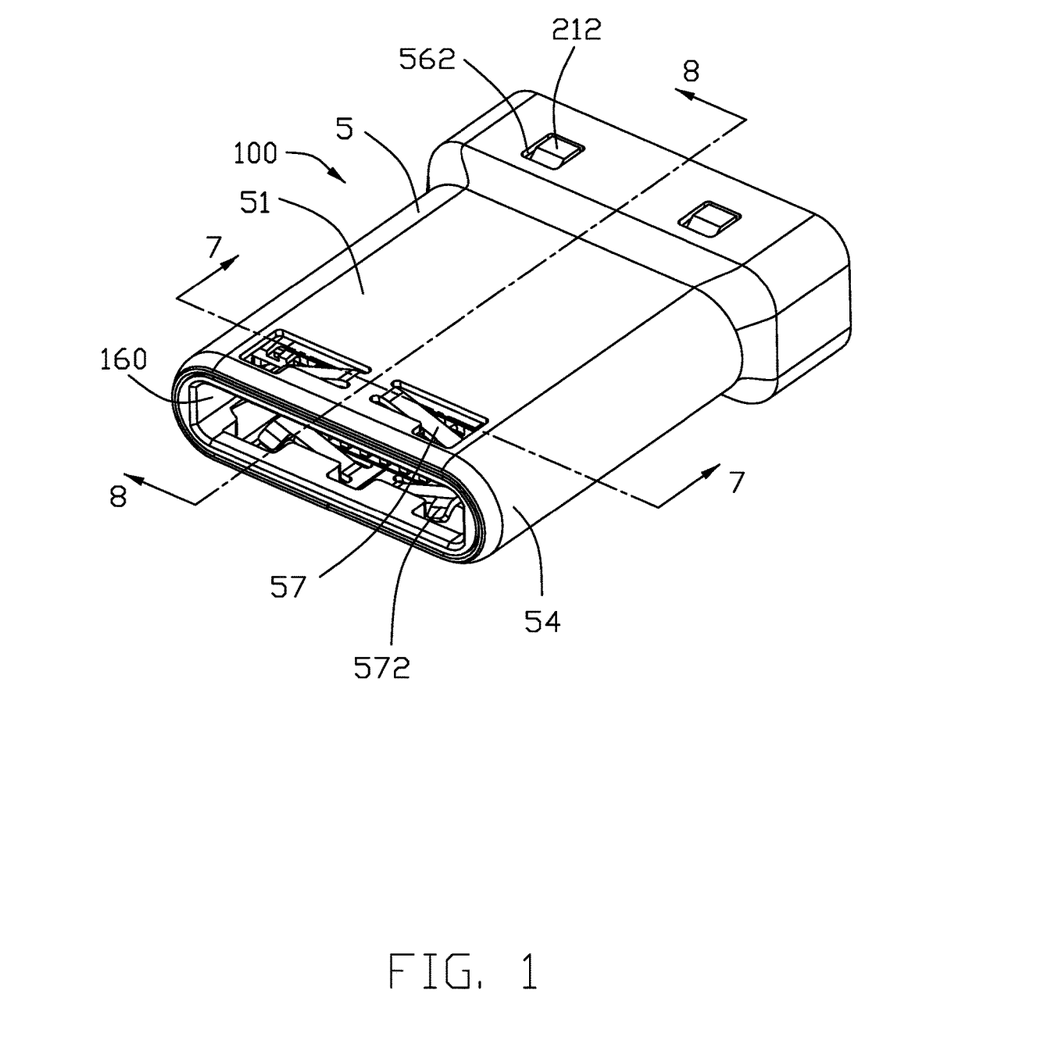
FIG. 1 is a front and top perspective view of an electrical connector in accordance with the present invention.
Figure 2:
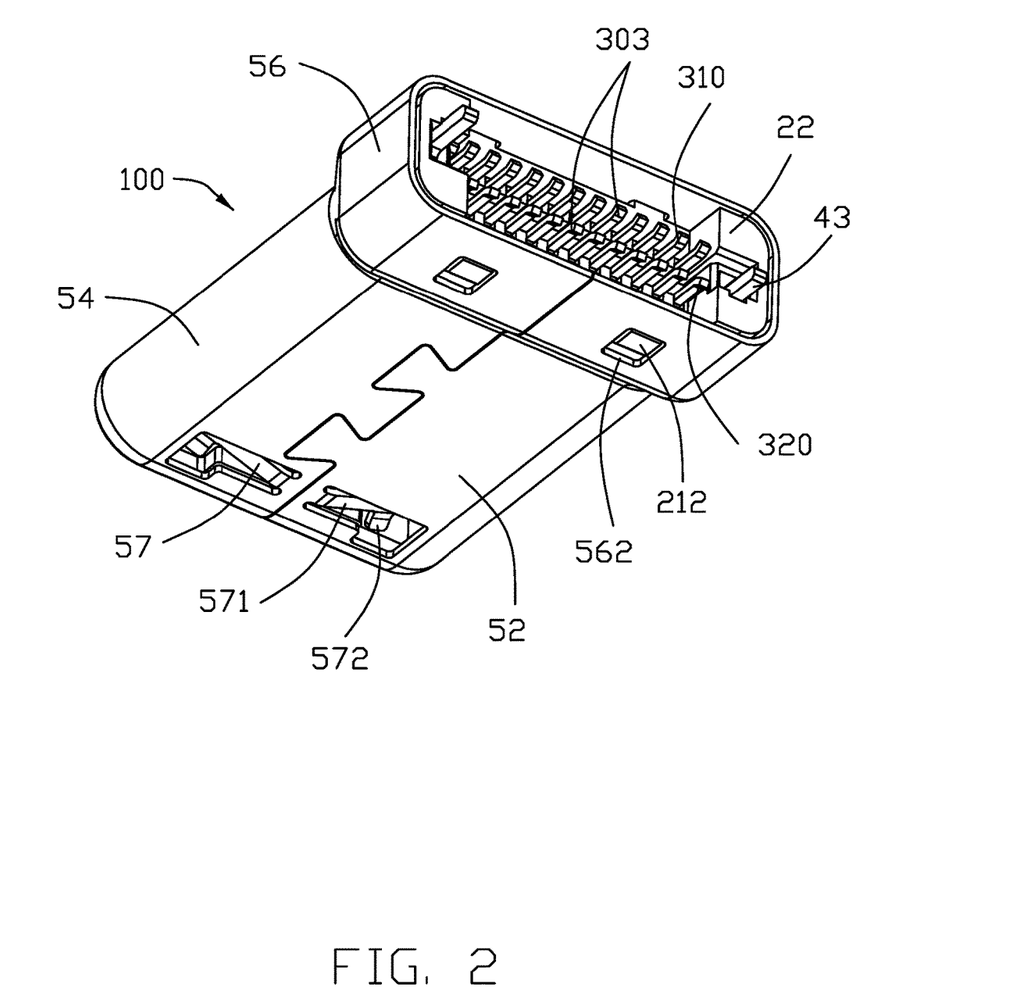
FIG. 2 is a rear and bottom perspective view of the electrical connector.
Figure 3:
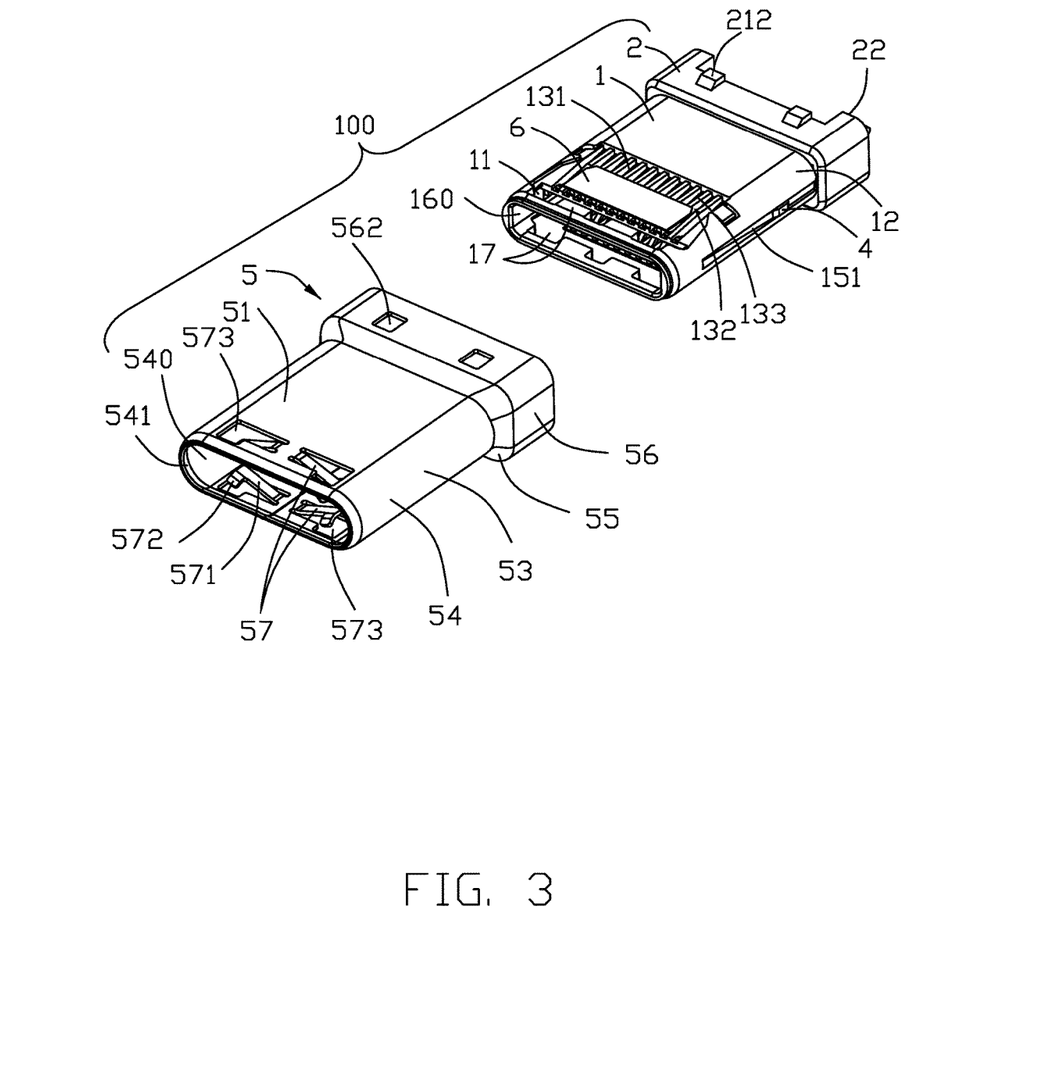
FIG. 3 is an exploded view of the electrical connector.
Figure 4:
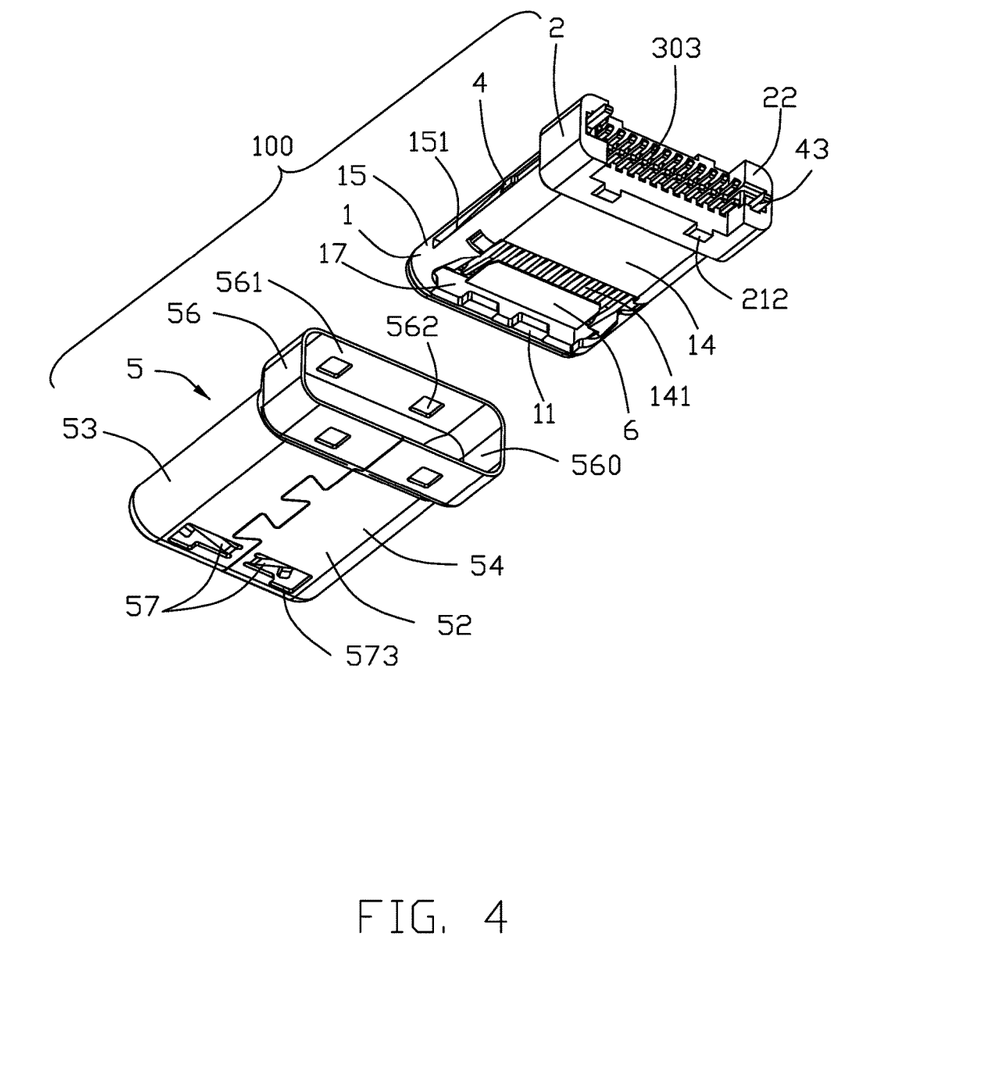
FIG. 4 is a view similar to FIG. 3 but from a different perspective.
Figure 5:
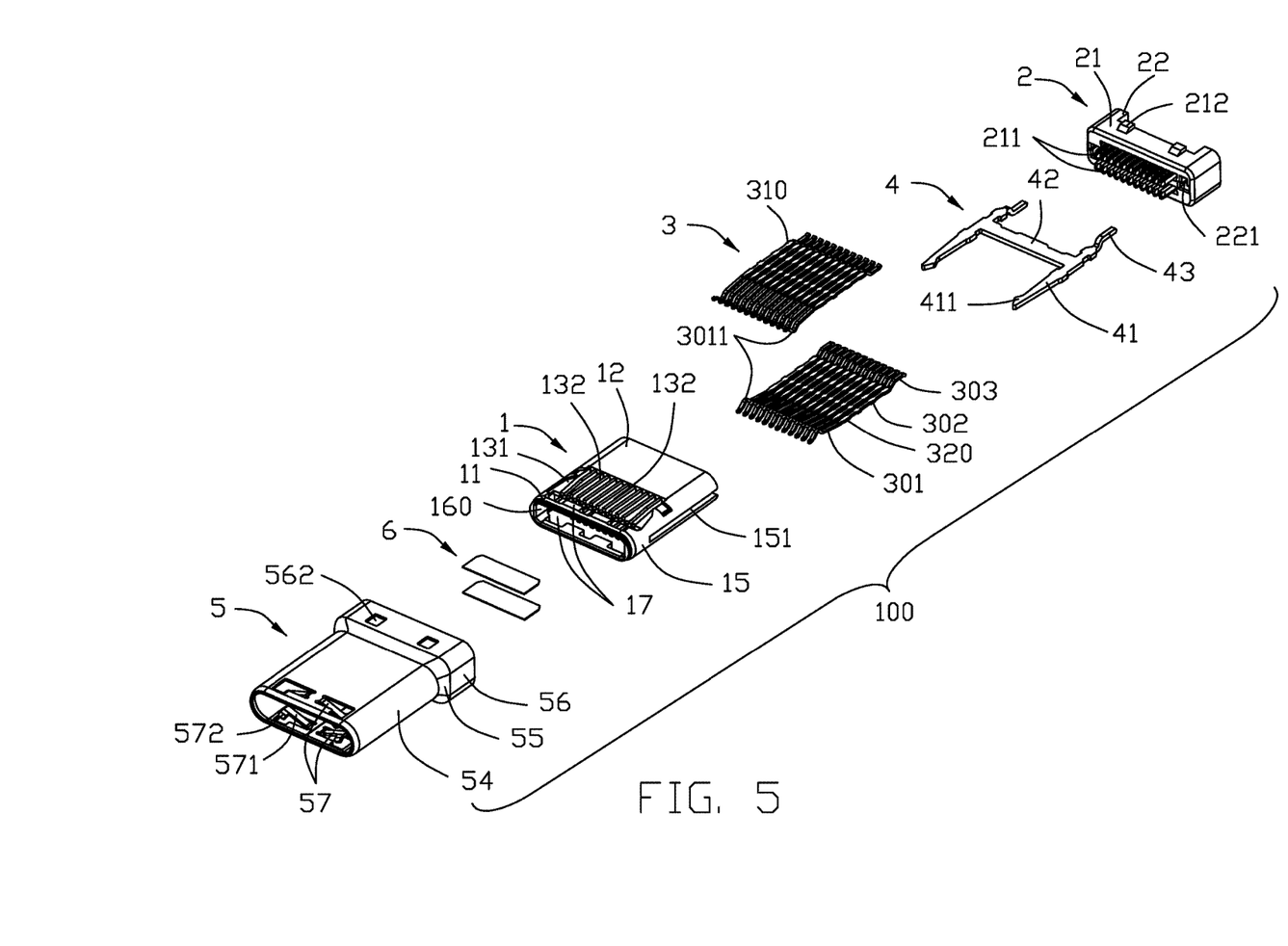
FIG. 5 is a further exploded view of the electrical connector in FIG. 3.
Figure 6:
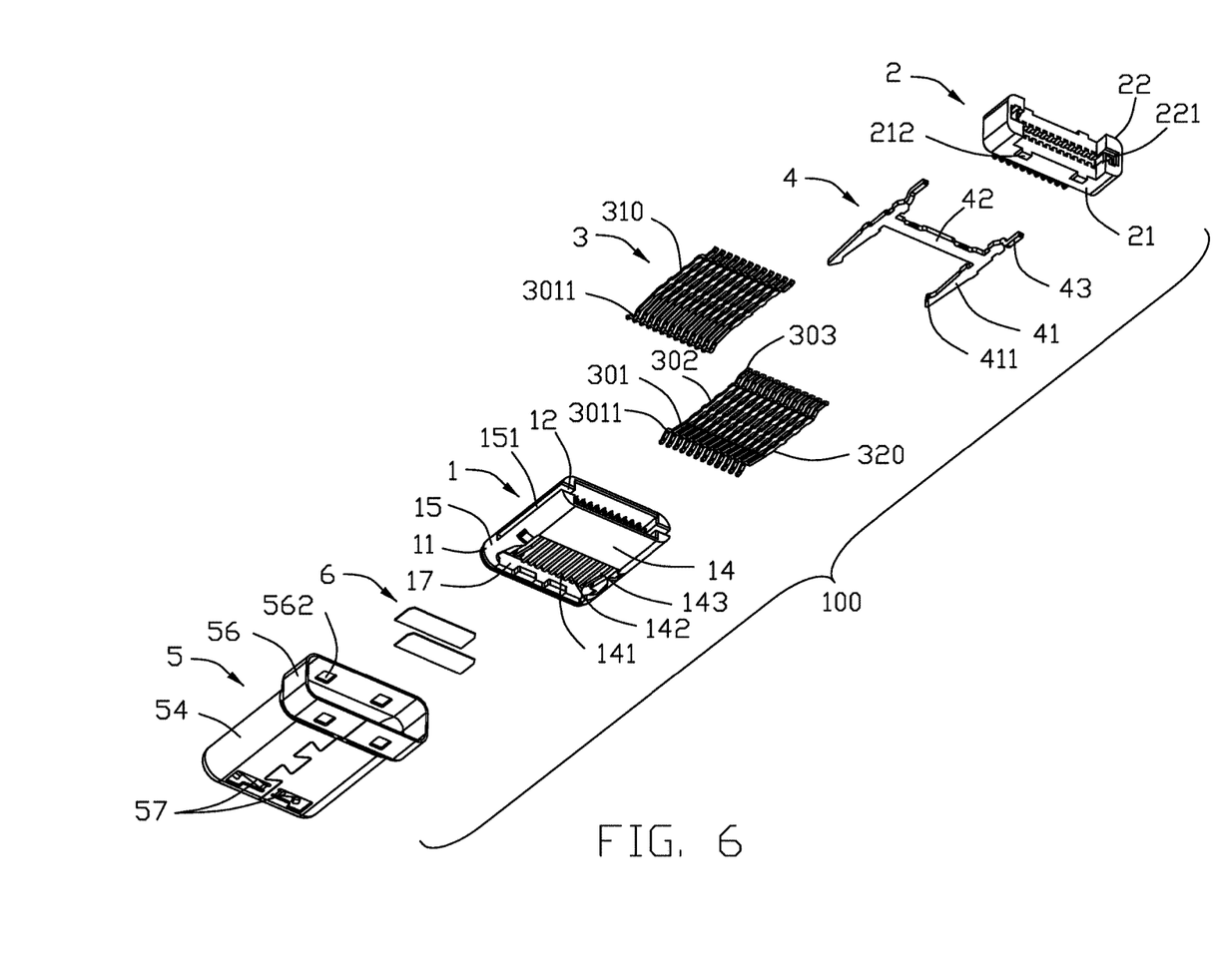
FIG. 6 is a view similar to FIG. 5 but from a different perspective.
Figure 7:
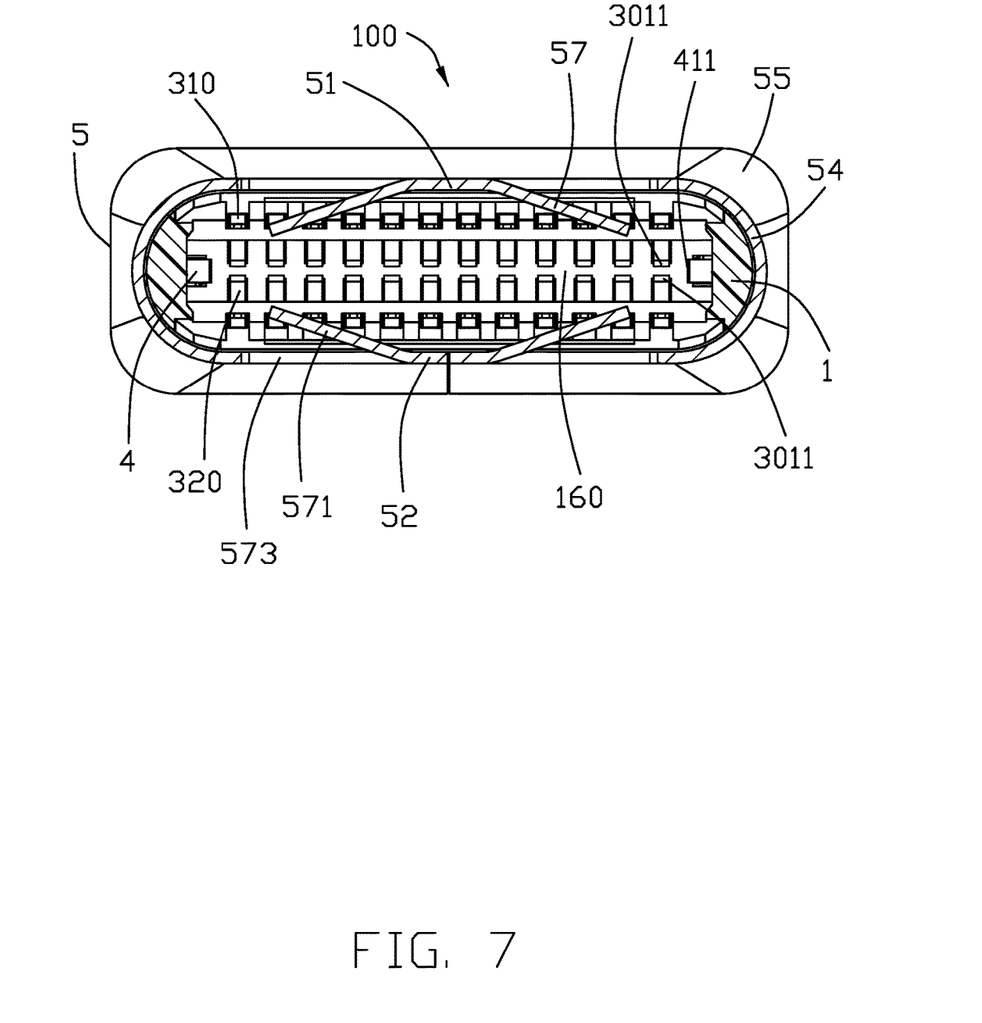
FIG. 7 is a cross-sectional view of the electrical connector taken along line A-A in FIG. 1.
Figure 8:
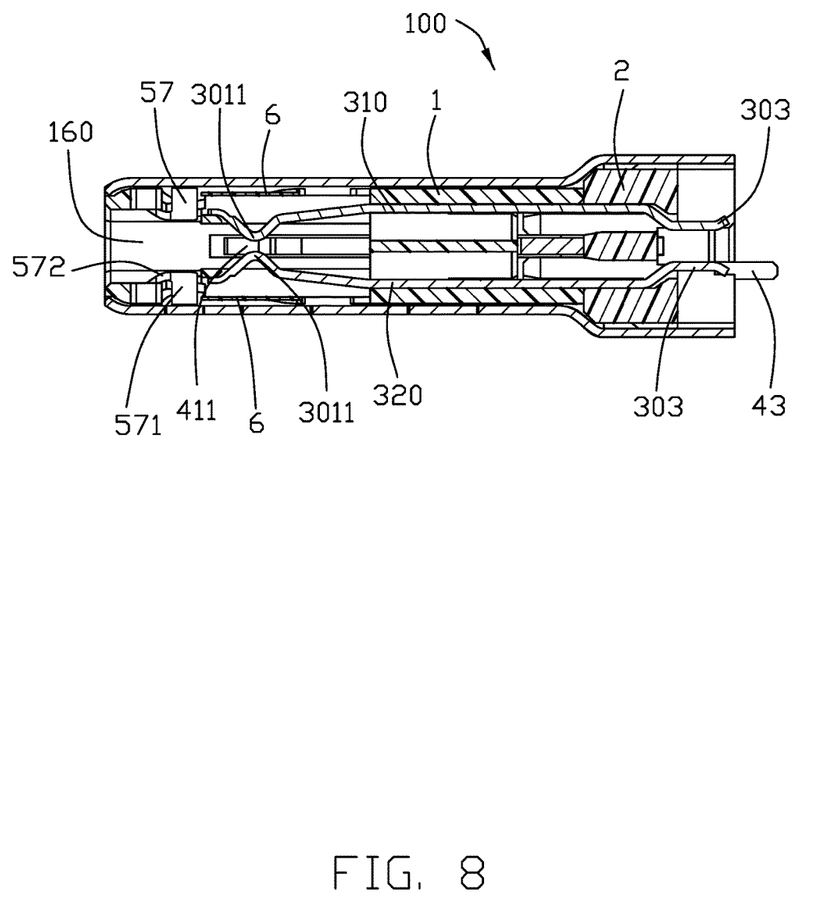
FIG. 8 is a cross-sectional view of the electrical connector taken along line B-B in FIG. 1.

Referring to FIGS. 1 to 8, an electrical connector 100 comprises an insulative housing, two rows of contacts 3 secured to the insulative housing, and a shielding shell 5 enclosing the insulative housing. The electrical connector 100 may further comprise a metal latch 4 and a pair of insulative sheets 6.

Referring to FIGS. 3-8, the insulative housing includes a body 1 and a base 2. The body 1 has a top wall 13, a bottom wall 14, and a pair of side walls 15 together surrounding a central receiving space 160. The body includes a front part 11 having a front opening and a rear part 12 having a rear opening. The top wall 13 has a recess 131 and the bottom wall 14 has a recess 141. Each of the top and bottom walls 13 and 14 has a respective pair of windows 17 at the front part 11. The recess 131 has a row of first slots 131 and dividers 132 and the recess 141 has a row of second slots 141 and dividers 142. The two rows of contacts 3 are exposed to the receiving space 160 through the first and second slots 131 and 141. Each of the pair of side walls 15 has a third slot 151.

Referring to FIGS. 2-6 and 8, the base 2 has a main portion 21 and a pair of blocks 22. The main portion 21 has plural protrusions 212, plural grooves 211, and a pair of fixing holes 221.

Referring to FIGS. 2-8, the contacts 2 include an upper row of contacts 310 and a lower row of contacts 320. Each contact 310 or 320 has a securing portion 302, a contacting portion 301, and a coupling portion 303. The contacting portion 301 has an apex 3011.

Referring to FIGS. 2 and 4-8, the metal latch 4 has a support 42, a pair of latching arms 41, and a pair of soldering legs 43. The latching arm 41 has an apex 411.

Referring again to FIGS. 1-8, the shielding shell 5 has a front tubular part 54 surrounding a receiving space 540 and a rear tubular part 56 surrounding a receiving space 560. The front tubular part 54 has a front end 541. Between the front tubular part 54 and the rear tubular part 56 is a tapered transition 55. The rear tubular part 56 has a rear end 561.

The shielding shell 5 includes a top wall/plate 51, a bottom wall/plate 52, and a pair of side walls/plates 53. Each of the top and bottom walls 51 and 52 has a respective pair of spring tangs 57 each extending laterally in a cantilevered manner into the receiving space 160 of the insulative housing through corresponding windows 17 of the insulative housing body 1. L-shaped corresponding windows/openings 573 are formed in the shielding shell 5, via which the spring tangs 57 are formed. Each spring tang 57 has an arm 571 and a guiding protrusion 572. The arms 571 of each pair of spring tangs 57 extend in opposite directions. The arm 571 and the protrusion 572 are substantially L-shaped. The shielding shell 5 further includes plural holes 562.

The electrical connector 100 is assembled in a known manner in this art with the contact coupling portions 303 and the latch soldering legs 43 ready to be terminated to an internal printed circuit board. In other embodiments, the two rows of contacts and the metal latch 4 may be insert molded with the insulative housing base 2. In the embodiment shown, all the spring tangs 57 are located entirely forwardly of the contacts 3.

What is claimed is:

1. An electrical connector comprising:
    an insulative housing having a central receiving space;
    two rows of contacts secured to the housing and exposed inwardly to the receiving space; and
    a shielding shell enclosing the insulative housing, the shielding shell having a respective pair of spring tangs at each of two opposite walls thereof, each of the spring tang extending laterally in a cantilevered manner into the receiving space, wherein each spring tang has a frontal guiding protrusion.

2. The electrical connector as claimed in claim 1, wherein the spring tangs are located entirely forwardly of the contacts.

3. The electrical connector as claimed in claim 1, wherein each pair of spring tangs extend in opposite directions.

4. An electrical connector comprising:
    a tubular insulative housing having opposite top and bottom walls with a central receiving space therebetween in a vertical direction, said receiving space forwardly communicating with an exterior in a frontto-back direction perpendicular to said vertical direction, each of said top and bottom walls forming a window communicating with the receiving space in the vertical direction;

two rows of contacts secured to the housing and respectively located in the top and bottom walls with contacting sections extending inwardly to the receiving space in the vertical direction;

a tubular shielding shell enclosing the insulative housing, the shielding shell having opposite top and bottom plates covering the corresponding top and bottom walls, respectively; and a spring tang unitarily stamped and extending from each of said top and bottom plates and through the corresponding window into the receiving space in a cantilevered manner; wherein each spring tang has a frontal guiding protrusion located at a free end thereof and extending in the front-to-back direction so as to commonly form an L-shaped configuration; and each of said top and bottom plates forms an L-shaped opening corresponding to the L-shaped configuration of the spring tang.

5. The electrical connector as claimed in claim 4, wherein the spring tangs are located in front of the contacts in said front-to-back direction.

6. The electrical connector as claimed in claim 4, wherein the spring tang extends in a transverse direction perpendicular to both said vertical direction and said front-to-back direction.

7. An electrical connector comprising:

a tubular insulative housing having opposite top and bottom walls with a central receiving space therebetween in a vertical direction, said receiving space forwardly communicating with an exterior in a front-to-back direction perpendicular to said vertical direction, each of said top and bottom walls forming a window communicating with the receiving space in the vertical direction;

two rows of contacts secured to the housing and respectively located in the top and bottom walls with contacting sections extending inwardly to the receiving space in the vertical direction;

a tubular shielding shell enclosing the insulative housing, the shielding shell having opposite top and bottom plates covering the corresponding top and bottom walls, respectively; and a spring tang unitarily stamped and extending from each of said top and bottom plates and through the corresponding window into the receiving space in a cantilevered manner, wherein the spring tang extends in a transverse direction perpendicular to both said vertical direction and said front-to-back direction.

\* \* \* \* \*